(12) United States Patent
Lan

(10) Patent No.: US 9,563,119 B2
(45) Date of Patent: Feb. 7, 2017

(54) LARGE-AREA NANOPATTERNING APPARATUS AND METHOD

(71) Applicant: Hongbo Lan, Qingdao (CN)

(72) Inventor: Hongbo Lan, Qingdao (CN)

(73) Assignee: QINGDAO BONA OPTOELECTRONICS EQUIPMENT CO., LTD., Qingdao (CN)

(*) Notice: Subject to any disclaimer, the term of this patent is extended or adjusted under 35 U.S.C. 154(b) by 235 days.

(21) Appl. No.: 14/362,464

(22) PCT Filed: Oct. 25, 2012

(86) PCT No.: PCT/CN2012/001430
§ 371 (c)(1),
(2) Date: Jun. 3, 2014

(87) PCT Pub. No.: WO2014/047750
PCT Pub. Date: Apr. 3, 2014

(65) Prior Publication Data
US 2014/0305904 A1    Oct. 16, 2014

(30) Foreign Application Priority Data

Sep. 29, 2012 (CN) .......................... 2012 1 0376654

(51) Int. Cl.
*C23F 1/00* (2006.01)
*G03F 7/00* (2006.01)
(Continued)

(52) U.S. Cl.
CPC .......... *G03F 7/0002* (2013.01); *H01L 33/0095* (2013.01); *B82Y 10/00* (2013.01); *B82Y 40/00* (2013.01); *H01L 2933/0083* (2013.01)

(58) Field of Classification Search
CPC .......... B82Y 10/00; G03F 7/00; G03F 7/0002; H01L 2933/0083; H01L 33/0095; B29C 43/58; B29C 43/021; B29C 2043/5833; B29C 2043/5808
(Continued)

(56) References Cited

U.S. PATENT DOCUMENTS

2007/0134362 A1* 6/2007 Heidari ................... B44B 5/009
425/385
2010/0059904 A1* 3/2010 Kasumi ................. B29C 59/022
264/293
(Continued)

FOREIGN PATENT DOCUMENTS

CN    1979336 A    6/2007
CN    101104318 A    1/2008
(Continued)

OTHER PUBLICATIONS

Jun. 6, 2013 International Search Report issued in International Patent Application No. PCT/CN2012/001430 (with translation).
(Continued)

*Primary Examiner* — Lan Vinh
(74) *Attorney, Agent, or Firm* — Knobbe, Martens, Olson & Bear LLP

(57) ABSTRACT

The present invention discloses a nanoimprint apparatus and method useful in the cost-effective mass production of nanostructures over large areas on various substrates or surfaces, especially suitable for non-flat substrates or curved surfaces. The nanoimprint apparatus is composed of a wafer stage, a vacuum chuck, a substrate, a UV-curable nanoimprint resist and the like. The method implementing large-area nanopatterning based on the apparatus includes the following steps: (1) pretreatment, (2) imprinting, (3) curing, (4) demolding, (5) post treatment and (6) transferring of imprinted patterns. By utilizing the apparatus and the
(Continued)

approach, large-area, and/or high-aspect-ratio micro/nano-structures can be mass produced, especially on a non-flat substrate or a curved surface or a fragile substrate at low cost and high throughput.

13 Claims, 4 Drawing Sheets

(51) Int. Cl.
 *H01L 33/00* (2010.01)
 *B82Y 40/00* (2011.01)
 *B82Y 10/00* (2011.01)

(58) Field of Classification Search
 USPC .... 156/345.5, 345.51, 345.52; 118/724, 725, 118/733; 216/40, 41, 44, 48
 See application file for complete search history.

(56) References Cited

U.S. PATENT DOCUMENTS

| | | | |
|---|---|---|---|
| 2011/0140304 | A1 | 6/2011 | Choi et al. |
| 2011/0183070 | A1 | 7/2011 | Choi et al. |
| 2011/0244131 | A1* | 10/2011 | Kawamura ............ B82Y 10/00 427/256 |

FOREIGN PATENT DOCUMENTS

| | | |
|---|---|---|
| CN | 102346369 A | 2/2012 |
| CN | 102591143 A | 7/2012 |
| CN | 202771153 U | 6/2013 |
| TW | 201135352 A1 | 10/2011 |

OTHER PUBLICATIONS

Jun. 6, 2013 Written Opinion issued in International Patent Application No. PCT/CN2012/001430 (with translation).

* cited by examiner

LARGE-AREA NANOPATTERNING APPARATUS AND METHOD

FIELD OF THE INVENTION

The present invention belongs to the technical field of micro/nano manufacturing and manufacturing of optoelectronic devices, and particularly, to a nanoimprint apparatus and method useful in the patterning large area nanostructures on non-flat substrates or surfaces.

BACKGROUND OF THE INVENTION

LED patterning (patterning sapphire substrate and LED epitaxial wafer patterning) has been considered as the most effective methods for enhancing light generation efficiency and light extraction efficiency and improving the quality of a light source (controlling the emitting direction of light and the uniformity of far field patterns) in academia and industry, namely so-called Nano-Patterned Sapphire Substrate (NPSS) and LED epitaxial wafer patterning technology (Photonic Crystal LED, Nanorod LED and Nanowire LED, etc.) is regarded as one of the most effective technical solutions for improving the light extraction efficiency and realizing ultrahigh-brightness LED in industry at present. Different from a flat clean silicon wafer used in the traditional IC field, a sapphire substrate and an LED epitaxial wafer have the characteristics of non-flat surface, warp, bow, large variation of thickness, sharp surface protrusions of several microns, relatively obvious surface defects and particle contaminants and fragility. Hence, it is extremely difficult to mass produce high-aspect-ratio micro/nano structures over large area at low cost high throughput and in large scale on the surface of the non-flat LED epitaxial wafer or sapphire substrate by adopting various existing micro/nano-manufacturing methods, and the requirement for LED patterning industrial-level application can not be met. For example, because the LED epitaxial wafer has the properties, e.g. warp, bow, surface waviness and sharp protrusions, the depth of focal for the traditional photolithography cannot adapt to the requirement of exposure over a large area; and when the large-area nanostructures are manufactured by using electron beam lithography, the cost is extremely high, the productivity is particularly low, and mass production is also extremely difficult. For NPSS, the existing contact or proximity lithography equipment cannot satisfy the resolution requirement. Although Stepper has been used to produce NPSS, the Stepper used in the semiconductor industry is too expensive for the LED industry, so that the manufacturing cost of LEDs is greatly improved. However, LEDs are especially sensitive to the production cost. In addition, some enterprises adopt second-hand renovated Stepper at present, which has problems on the aspects of product yield, equipment reliability and the like. Interference lithography has great advantages on forming periodic micro/nano structures over large areas, but the method has significant defects of poor selectivity of nanopatterns and severe requirement for a production environment (poor compatibility with an LED production process), and particularly, there is almost no commercial company which can provide a mature interference lithography machine (for patterning a full wafer) at present. Although other nanomanufacturing methods such as nanosphere lithography, anode aluminum oxide (AAO) templates, block copolymer self-assembly and the like have been attempted to be applied to the LED patterning, these methods show some limits, such as cost, productivity, consistency, yield, large-scale manufacturing and the like. The requirements of industrial-level production of the LED patterning with high throughput, low cost and good consistency cannot be satisfied.

Nanoimprint Lithography (NIL) is a novel micro/nanopatterning method which is based on the principle of mechanically modifying a thin polymer film (mechanical deformation of the resist) using a template (mold, stamp) containing the micro/nanopattern, in a thermo-mechanical or UV curing process. Compared with other micro/nanomanufacturing methods, NIL has the characteristics of high resolution, ultralow cost (the international authority assesses that the NIL of the equivalent manufacturing level is at least one order of magnitude lower than the traditional optical projection lithography) and high throughput, has the most significant advantage of manufacturing capability of large-area and complex three-dimensional micro/nanostructures, and particularly has the potential of implementing wafer-level nanoimprint on a non-flat (bow, warp or stepped) and fragile substrate by using soft UV-NIL process and the unique continuous nanopatterning capability for roll-to-roll NIL process. NIL has been considered as the most ideal technical solution for implementing large-area nanopatterning in academia and industry. However, the existing nanoimprint process applied to the LED patterning has many weaknesses on the aspects of mold life time, throughput, yield, reliability and the like, and particularly faces some challenging issues, such as difficulty in large-area demolding, deformation of a soft mold, damage to the mold due to particle contaminants and sharp protrusion defects, consistency and repeatability of imprinted patterns and the like. In addition, in the following process of a pattern transfer a material such as sapphire, GaN and the like is difficult to etch, and a hard mask layer generally needs to be deposited at first. To reduce the production cost and shorten the process route, a feature structure with high-aspect-ratio is directly imprinted on the resist, so that a hard mask layer procedure may be eliminated, the production process is simplified and the production cost is reduced. Hence, the LED patterning has a very urgent demand for some novel nanoimprint lithography technology for cost-effective mass production of large-area and high-aspect-ratio micro/nanostructures at low cost and high throughput on a non-flat substrates or curved surfaces or fragile substrates.

Therefore, to meet the industrial-level application requirement of the LED patterning and other large area nanopatterning, a new nanoimprint process and equipment need to be developed urgently, wherein the equipment has the capability of mass producing large-area and high-aspect-ratio micro/nanostructures at low cost and high throughput on non-flat substrate or surfaces.

SUMMARY OF THE INVENTION

The objective of the present invention is to solve the above-mentioned problems and provide a nanoimprint apparatus and method useful in the nanopatterning of large area substrates or fabricating large area nanostructures, for manufacturing a large-area and high-aspect-ratio micro/nano structure with high throughput and low cost on a non-flat surface (bow, warp, stepped or protruding) or curved surface or fragile substrate by adopting a low-cost water-soluble and thin-film structured flexible composite mold in combination with a large-area nanoimprint process and a gas-assisted progressive sequential pressing and peel-off demolding method.

To fulfill the above-mentioned objective, the present invention adopts the following technical solution.

A nanoimprint apparatus useful in cost-effective mass production of nanostructures over large areas on various substrates or surfaces, especially suitable for non-flat substrates or curved surfaces is composed of a wafer stage, a vacuum chuck, a substrate (wafer or epitaxial wafer), a UV-curable nanoimprint resist, a mold, a gas valve plate, an imprint mechanism, a UV light source, a mold feeding mechanism, vacuum pipelines and pressure pipelines, wherein the vacuum chuck is fixed on the wafer stage, the substrate is attached to the vacuum chuck, and the liquid UV-curable nanoimprint resist is coated on the substrate; the mold is arranged outside a unwind roll for placing a thin-film structured mold, two auxiliary supporting rolls and a rewind roll for rewinding an used mold in the mold feeding mechanism, the mold is placed above the substrate coated with the liquid UV-curable nanoimprint resist and below the gas valve plate through the auxiliary supporting rolls, the gas valve plate is fixed below the imprint mechanism, and the UV light source is fixed above the imprint mechanism; and the vacuum pipelines and the pressure pipelines are connected with gas inlets of the gas valve plate and connected with a gas inlet of the vacuum chuck.

The mold is a water-soluble thin-film structured elastic composite transparent flexible mold and includes a patterned layer and a support layer, wherein the patterned layer has the characteristics of water solubility, high elasticity modulus, high transparency, thermal stability and good mechanical property and is made of a water-soluble macromolecular compound such as polyvinyl alcohol (PVA) or poly(acrylic acid) (PAA) or the like. The support layer is made of a transparent high-elasticity thin-film structured PET material. The patterned layer contains micro/nanostructures (patterns) to be replicated, and the support layer is located on the patterned layer. The thickness of the patterned layer is 10 to 50 microns, and the PET thickness of the support layer is 100 to 200 microns. The mold is manufactured by adopting a roll-type imprinting process, a printing electronic technique or a traditional nanoimprint technique.

The mold feeding mechanism includes the unwind roll for placing the thin-film structured mold, the rewind roll for rewinding the used mold, the auxiliary supporting rolls and a guiding mechanism and anti-deflecting module and is divided into two axisymmetric sides about the left and right, the unwind roll for placing the thin-film structured mold and one auxiliary supporting roll are arranged on one side, the unwind roller for placing the thin-film structured mold is closer to the central axis of the mold feeding mechanism than the auxiliary supporting roll, the rewind roller for rewinding the used mold and the other auxiliary supporting roll are arranged on the other side, the rewind roll for rewinding the used mold and the unwind roll for placing the thin-film structured mold are symmetrical about the central axis of the mold feeding mechanism, and the auxiliary supporting roll and the other auxiliary supporting roll are symmetrical about the central axis of the mold feeding mechanism.

The wafer stage is an x-y precision stage, for changing the position of the substrate and implementing positioning and position adjustment of the substrate and the mold in the imprinting process.

The imprint mechanism includes a one-dimensional displacement platform moving vertically along a z-axis direction and a connecting support for the UV light source, wherein a plurality of buffer gaskets are arranged below the connecting support.

The UV light source is a UV LED lamp array.

The working range of the pressure pipelines is 0-2 bar; and the working pressure in the imprinting process is 10-100 mbar.

The working range of the vacuum pipelines is −0.1 bar to −0.4 bar, and the working pressure in the imprinting process is −300 Pa to −5 kPa.

A closed area I defined by the vacuum chuck and the space below the mold in the imprint working process is a low-pressure vacuum environment, and a closed area II defined by the space above the mold and the imprint mechanism is a pressure environment.

A working method adopted by the above-mentioned nanoimprint apparatus for the high-brightness LED patterning includes the following steps:
(1) pretreatment;
(2) imprinting;
(3) curing;
(4) demolding;
(5) post treatment; and
(6) transferring of imprinted patterns.

The working process of step (1) is: a layer of liquid UV-curable nanoimprint resist is spun onto a substrate, the substrate is placed on a vacuum chuck above a wafer stage, and the substrate coated with the UV-curable nanoimprint resist is fixed on the vacuum chuck in an attraction manner through vacuum suction; and the wafer stage is moved from an initial position to an imprint position, wherein the imprint position is a central position below a mold.

The working process of step (2) is:
(2-1) an imprint mechanism drives a gas valve plate and a UV light source to move from the initial position to the substrate till buffer gaskets of the imprint mechanism are completely in close contact with a support layer on the upper surface of the mold and a patterned layer on the lower surface of the mold is completely in close contact with buffer gaskets on the vacuum chuck; the space below the mold and the vacuum chuck form a closed area I, the space above the mold and the imprint mechanism define a closed area II, and sealing and air tightness of the closed areas I and II should be ensured in the imprinting and demolding processes;
(2-2) pressure pipelines in the gas valve plate are opened one by one from the central position of the gas valve plate to two outer sides, and the mold is in progressive sequential conformal micro-contact with the UV-curable nanoimprint resist on the substrate under the action of pressure applied by compressed air;
(2-3) after the mold is completely in conformal uniform contact with the UV-curable nanoimprint resist, on the one hand, a vacuum pipeline is opened in the vacuum chuck to form a low-pressure vacuum environment in the closed area I, and the defect of bubbles trapped in the imprinting process is removed, so that the thin-film structured mold is completely in conformal contact with the liquid UV-curable nanoimprint resist on the substrate; meanwhile, pressures of all the pressure pipelines of the gas valve plate are uniformly increased, a low pressure environment is formed in the closed area II defined by the space above the mold and the imprint mechanism, a uniform imprint force is applied to the thin-film structured mold to realize complete filling of the UV-curable nanoimprint resist in a micro/nano structure cavity of the mold, and the UV-curable nanoimprint resist is thinned to a predefined residual layer thickness; or the direct initial remaining film thickness is the same as the height of an imprint feature structure to realize remaining film-free imprint, and damage of the mold due to direct contact between the disposable mold and the substrate does not need to be worried.

The working process of step (3) is:

(3-1) firstly, the pressure applied to the mold is gradually released, so that deformation of the mold is completely released;

(3-2) then, the UV light source is turned on, and UV light passes through the mold to expose the UV-curable nanoimprint resist, so as to fully cure the UV-curable nanoimprint resist, wherein the curing time is 10-30 s.

The working process of step (4) is:

(4-1) firstly, the pressure pipelines of the gas valve plate and the vacuum pipeline of the vacuum chuck are closed;

(4-2) vacuum pipelines in the gas valve plate are opened one by one from the two outermost sides of the gas valve plate to the center of the mold at the same time, so that the closed area II forms a low-pressure vacuum environment; meanwhile, a pressure pipeline is opened on the vacuum chuck, so that the closed area I forms a low pressure environment, and continuous "peel-off" demolding of the mold from the two outer sides of the substrate to the center is realized; finally, the central position of the mold is separated from the polymer cured on the substrate, to realize full separation of the mold and the imprint structure and finish demolding;

(4-3) finally, the vacuum pipelines in the gas valve plate, the pressure pipeline of the vacuum chuck and an intake pipeline of a pressure passageway of the buffer gaskets on the vacuum chuck are closed, and the buffer gaskets are reset.

The working process of step (5) is:

(5-1) the imprint mechanism moves upwards and returns to the initial position; meanwhile, the wafer stage moves to a substrate replacing position, the vacuum pipeline on the vacuum chuck is closed, the imprinted substrate is taken down, a new substrate is loaded, the vacuum pipeline on the vacuum chuck is opened at the same time, and the new substrate is fixed on the vacuum chuck;

(5-2) meanwhile, a rewind roll for rewinding the used mold rotates, the thin-film structured mold is fed forwards, and the size of feeding movement is greater than the maximum size of the substrate; and a new imprinting process is repeated.

The working process of step (6) is:

(6-1) the residual mold material in the UV-curable nanoimprint resist structure is removed; the substrate and the micro/nano feature structure imprinted on the substrate are put into an aqueous solution of 70-100° C. for 5 to 10 minutes, and the residual mold material in the imprint structure is removed;

(6-2) then the feature structure is transferred to the substrate through an etching process by using the cured and imprinted UV-curable nanoimprint resist as a mask; or the feature structure is transferred to other functional structure material through a "Lift-off" process, wherein the etching process includes dry etching or wet etching.

The present invention adopts the following working principle.

(1) A low-cost water-soluble thin-film structured flexible composite mold is introduced. The imprinting process adopts "compressed gas and low-pressure vacuum assisted pressing" and adopts a manner of uniform progressive sequential micro-contact imprint from the central position of the mold to the two outer sides, so that uniform distribution of an imprint force on the non-flat (protruding, waved, curved and the like) substrate is achieved under the coaction of a gas-assisted imprint force on the mold, a vacuum suction of the lower part of the mold and a capillary force based on the thin-film structured elastic mold structure, complete conformal close contact between the mold and the UV-curable nanoimprint resist on the non-flat substrate is realized under the condition of a small imprinting force, and the defect of bubbles trapped in the imprinting process is overcome. A continuous "peel-off" demolding manner of the mold from the two sides of the substrate to the center is adopted in the separation process, so that large-area demolding may be realized by adopting a tiny demolding force under the coaction of a vacuum suction above the mold and a demolding force applied by the compressed air below the mold.

(2) Through the thin-film structured elastic composite flexible mold and the method of compressed gas and low-pressure vacuum assisted progressive sequential pressing and uniform sequential micro-contact imprinting, uniform conformal contact of the non-flat substrate is realized, consistency of large-area imprinted patterns on the non-flat substrate is ensured, and the problem that particle contaminants are introduced in the imprinting process is solved.

(3) In the imprinting process, the mold and the UV-curable nanoimprint resist are in the low-pressure vacuum environment, so that the problem of removal of bubbles trapped in the large-area imprinting process is solved, complete contact of the mold and the substrate is ensured, and consistency of the imprinted patterns is improved.

(4) By using the disposable water-soluble mold, the problems of service life time and cost of the mold in the imprinting process are solved, in addition, imprinting defects are reduced, the quality is improved, some high-aspect-ratio micro/nano feature structure is extremely fragile or adhered to an imprinted structural layer in the demolding process due to the factors such as adhesion of the mold and the cured polymer and non-uniform demolding force, and the mold material left in the imprinted structural layer may be removed in the aqueous solution without damaging the patterned layer.

The present invention has the following innovations and beneficial effects.

(1) The mold used in the present invention is a disposable low-cost mold. Namely, a water-soluble material is adopted and is easy to remove; due to the thin-film structure and high elasticity of the mold, good conformal contact between the mold and the non-flat substrate is ensured; and the defect problem caused by particle contaminants in the production environment in the nanoimprint process may also be effectively reduced.

(2) In the imprinting and demolding method of progressive sequential micro-contact, both the imprinting and demolding processes are based on a sequential and micro-contact mode, so that the deformation of the mold and the demolding force are reduced, and bubbles trapped in the imprinting process can be timely discharged or eliminated.

(3) The capability of complete conformal close contact between the non-flat (protruding, warped, bent or stepped) substrate and the thin-film structured elastic mold is realized under a small imprint force, and large-area uniform imprinting (consistency of large-area imprinted patterns) on the non-flat substrate is realized.

(4) The patterned layer of the mold is made of the water-soluble material, so even if the high-aspect-ratio micro/nano feature structure of the mold is left in the composite imprinted structural layer in the demolding process, it is extremely easy to remove. The quality of the imprinted patterns is improved, and the manufacturing of the large-area and high-aspect-ratio micro/nano structure is realized.

(5) The imprinting process is implemented under the low-pressure vacuum condition in combination with the progressive sequential micro-contact imprinting manner from the central position of the mold to the two outer sides, so that the technical problem of bubbles trapped in the large-area imprinting process is solved and good conformal contact under the small imprinting condition is ensured.

(6) Because the mold used in the present invention is a disposable mold, damage of the mold due to direct contact between the mold and the substrate does not need to be worried, and imprinting without a residual layer may be realized.

(7) An imprint force releasing process is adopted before curing to fully release the deformation of the mold, so as to improve the quality and precision of flexible mold imprinted patterns.

(8) The thin-film structured mold is manufactured by adopting a continuous roll-to-roll imprinting process and the like, and an imprint material is low in cost, so the mold is manufactured with the advantages of high throughput and low cost and meets the requirement of large-batch industrial-level application.

(9) The center of the mold is used as a symmetric axis in the imprinting process and the demolding process of the present invention, so the mold is stressed uniformly and symmetrically, and the imprinting and demolding processes are simultaneously performed on two sides, thus the production efficiency is high.

(10) The mold is disposable. The water-soluble mold solves the problems of damage to the mold caused by sharp protrusions, defects, particle contaminants and the like and low service life time of the mold and the technical problem that the demolding mold with the high-aspect-ratio structure is easy to damage.

(11) The present invention does not depend on an imprint force which is balanced, uniform and vertical to the surface and is applied by precision machinery, so the structure of equipment is simplified. Uniform pressing in the large-area imprinting process is realized through a gas-assisted pressure (a combination of positive pressure and negative pressure).

(12) The requirement for the production environment is low, the present invention is insensitive to un-smoothness, defects and particle contaminants of the substrate or the wafer, and the adaptability is high. These are very important in practical industrial application.

(13) The present invention combines the advantages of flat-plate imprinting and roll-type imprinting, and realizes high-throughput and low-cost manufacturing of the large-area micro/nano structure. An industrial-level solution is provided for commercial application of the large-area micro/nano structure.

The present invention has the most significant advantages that large-area and high-aspect-ratio micro/nano structures with high throughput and low cost are manufactured on the surfaces of various soft and hard substrates including non-flat (bow, warp, stepped or protruding) or curved-surface substrates or fragile substrates and an industrial-level application solution is provided for manufacturing of the large-area micro/nano structures or large-area nano patterning of the non-flat substrates or large-area nano patterning of curved surfaces or manufacturing of the high-aspect-ratio and large-area micro/nano structures.

The present invention is suitable for manufacturing of high density disks (HDD), micro optical elements (such as optical lenses, diffractive optical devices and the like), various (anti-reflecting, self-cleaning, anti-frost and the like) coatings, three-dimensional micro batteries, butterfly-type solar concentrators, compound eye image sensors, microfluidic devices, biosensors, MEMS devices, photovoltaic devices and the like, and is particularly suitable for industrial-level production of LED nano patterns (NPSS, photonic crystal LEDs, Nanorod LEDs, etc) and wafer-level micro optical elements as well as nanopatterning III-V substrates (or epitaxial wafer).

BRIEF DESCRIPTION OF THE DRAWINGS

FIG. 4b is a structural side section view of pipeline arrangement in the vacuum chuck of FIG. 4a;

In these figures, 1—wafer stage, 2—vacuum chuck, 3—substrate, 4—ultraviolet cured nanoimprint resist, 5—mold, 6—gas valve plate, 7—imprint mechanism, 8—UV light source, 9—mold feeding mechanism, 10—vacuum pipeline, 11—pressure pipeline, 201—first buffer gasket, 202—horizontal pressure pipeline, 203—vertical hole, 204—horizontal vacuum pipeline, 205—vertical pipeline attached to the substrate, 206—area I—communicating horizontal pipeline, 207—area I—communicating vertical pipeline, 501—patterned layer, 502—support layer, 50101—micro/nano feature structure, 50102—micro/nano structure cavity, 601—gas inlet, 602—groove surface, 701—connecting support, 702—second buffer gasket, 705—top surface, 706—bottom surface, 709—movement execution mechanism, 901—unwind roll for placing a thin-film structured web mold, 902—auxiliary supporting roll, 903—rewind roll for rewinding an used mold.

DETAILED DESCRIPTION OF THE EMBODIMENTS

The present invention will be further illustrated below in conjunction with the accompanying drawings and embodiments.

A 4-inch nanopatterned sapphire substrate is taken as an example in the present invention. A substrate 3 is the 4-inch sapphire substrate, a patterned layer 501 of a thin-film structured elastic composite flexible mold is made from water-soluble polyvinyl alcohol (PVA), and a support layer 502 is made of a high-transparency and elastic thin-film structured PET material.

Figure 1:
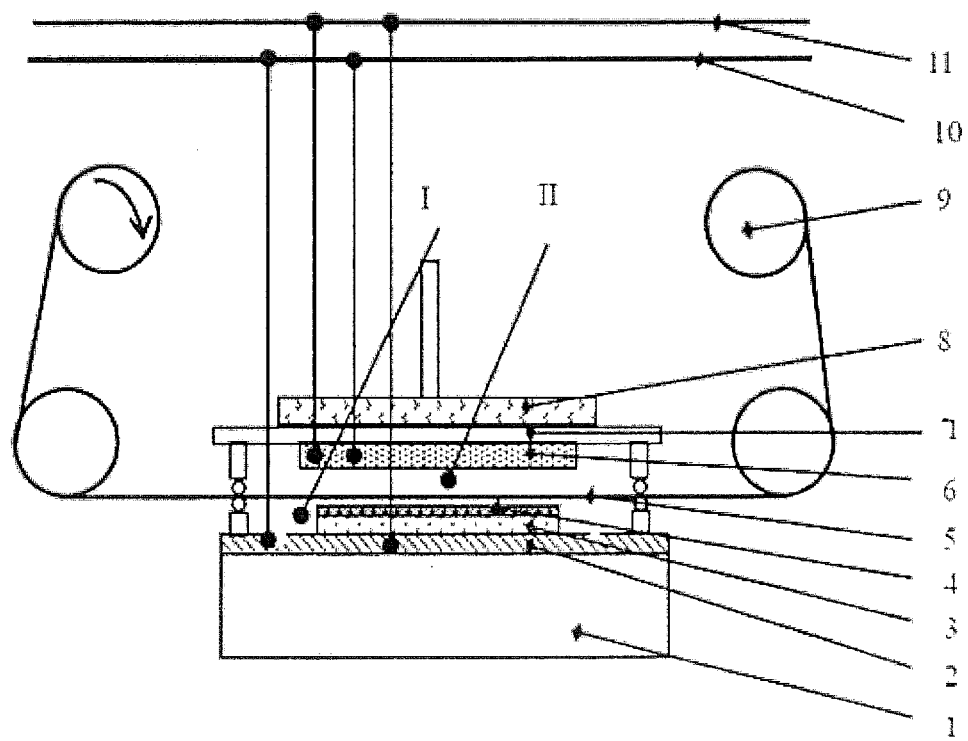
FIG. 1 is a structural schematic diagram of a nanoimprint apparatus useful in the cost-effective mass production of nanostructures over large areas on various substrates or surfaces.

FIG. 1 is a structural schematic diagram of a nanoimprint apparatus useful in the cost-effective mass production of nanostructures over large areas in the present invention. The nanoimprint apparatus is composed of a wafer stage 1, a vacuum chuck 2, a substrate 3, a UV-curable nanoimprint resist 4, a mold 5, a gas valve plate 6, an imprint mechanism 7, a UV light source 8, a mold feeding mechanism 9, a vacuum pipeline 10 and a pressure pipeline 11, wherein the substrate 3 coated with the UV-curable nanoimprint resist 4 is attached to the vacuum chuck 2, and the vacuum chuck 2 is fixed on the wafer stage 1; the gas valve plate 6 is fixed on the bottom surface 706 of the imprint mechanism 7, and the UV light source 8 is fixed on the top surface 705 of the imprint mechanism 7; and the mold 5 is arranged outside a unwind roll 901 for placing a thin-film structured mold, two auxiliary supporting rolls 902 and a rewind roll 903 for rewinding an used mold in the mold feeding mechanism 9, the mold 5 is placed above the substrate 3 coated with the liquid UV-curable nanoimprint resist 4 and below the gas valve plate 6 through the auxiliary supporting rolls 902, the vacuum pipeline 10 and the pressure pipeline 11 are connected with gas inlets 601 of the gas valve plate 6, the pressure pipeline 11 is connected with a horizontal pressure pipeline 202 of the vacuum chuck 2, the vacuum pipeline 10 is connected with a horizontal vacuum pipeline 204 of the vacuum chuck 2, and the vacuum pipeline 10 and the pressure pipeline 11 are connected with an area I-communicating horizontal pipeline 206 of the vacuum chuck 2.

Figure 2:
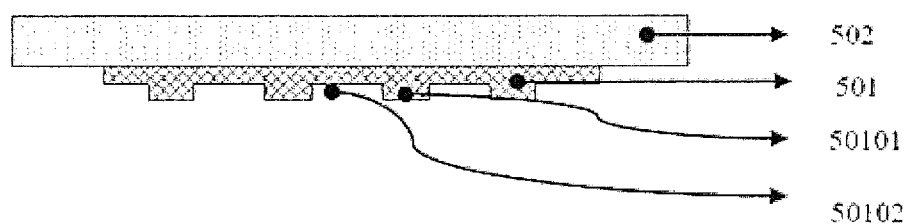
FIG. 2 is a structural schematic diagram of a water-soluble thin-film structured elastic composite flexible mold used with the apparatus of FIG. 1.

FIG. 2 is a structural schematic diagram of a water-soluble thin-film structured elastic composite flexible mold used in the present invention. The mold 5 is a two-layer thin-film structured elastic transparent flexible mold, and includes a patterned layer 501 and a support layer 502. The patterned layer 501 includes a micro/nano feature structure 50101 to be copied, the thickness of the patterned layer 501 is 40 microns, and the PET thickness of the support layer 502 is 150 microns. The support layer 502 is located on the patterned layer 501. The patterned layer 501 is made from a water-soluble polyvinyl alcohol (PVA); and the support layer 502 is made of a high-transparency and elastic thin-film structured PET material.

Figure 3:
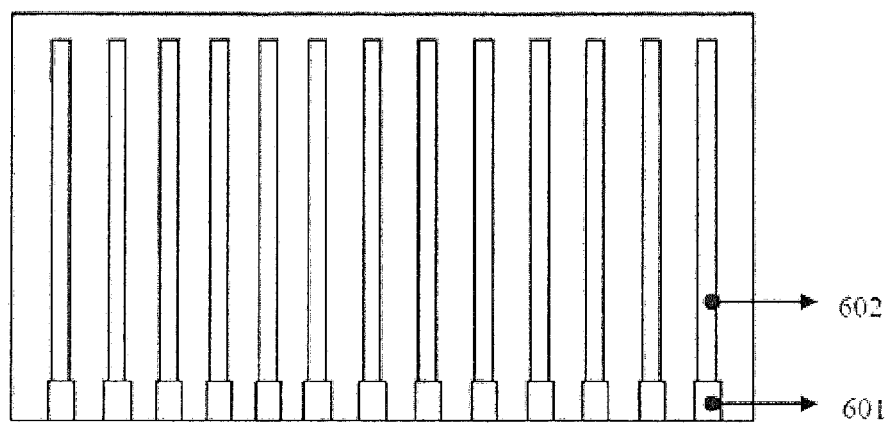
FIG. 3 is a structural schematic diagram of pipeline arrangement in a gas valve plate used with the apparatus of FIG. 1.

FIG. 3 is a structural schematic diagram of a gas valve plate 6 and pipeline arrangement therein in the present invention, wherein gas inlets 601 are formed on one lateral surface, groove surfaces 602 are machined on the bottom surface, and one side of each groove surface 602 is communicated with a gas inlet 601. The gas inlets 601 are connected with the vacuum pipeline 10 and the pressure pipeline 11.

Figure 4A:
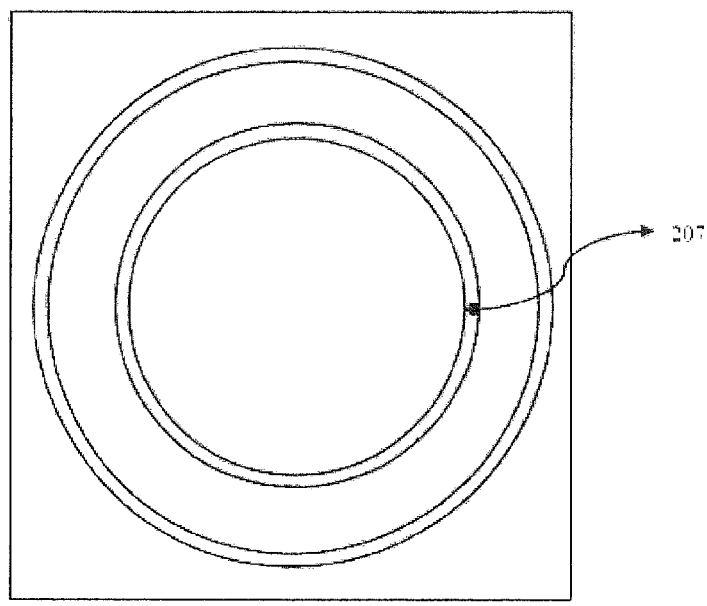
FIG. 4a is a structural top view of a vacuum chuck used with the apparatus of FIG. 1.
Figure 4B:
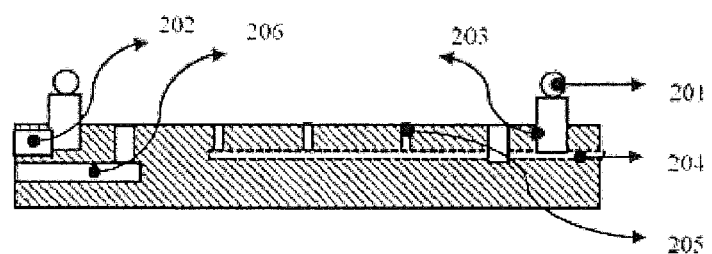

FIG. 4a is a structural top view of a vacuum chuck 2 of the present invention, and FIG. 4b is a structural side section view of pipeline arrangement in the vacuum chuck 2 of the present invention. The vacuum chuck 2 includes first buffer gaskets 201 (moving vertically and freely), vertical holes 203 for placing the first buffer gaskets 201, a horizontal pressure pipeline 202 (connected with the pressure pipeline 11, enabling the first buffer gaskets 201 to move upwards in an imprinting process through compressed gas provided by the pressure pipeline 11, and co-acting with the mold 5 and second buffer gaskets 702 (fixed) of the imprint mechanism 7 to form a closed area I) communicated with the vertical holes 203, a horizontal vacuum pipeline 204 (connected with the vacuum pipeline 10 and configured to provide negative pressure for attaching the substrate 3) fixedly attached to the substrate 3, vertical pipelines 205 (communicated with the horizontal vacuum pipeline 204) attached to the substrate, the area I-communicating horizontal pipeline 206 (connected with the vacuum pipeline 10 and the pressure pipeline 11, communicated with the vacuum pipeline 10 during imprinting, and communicated with the pressure pipeline 11 during demolding), and an area I-communicating vertical pipeline 207 (forming a low-pressure vacuum environment in the closed area I during imprinting; forming a positive pressure environment in the closed area I during demolding) communicated with the area I-communicating horizontal pipeline 206. Free movement of the first buffer gaskets 201 in the vertical holes 203 should be ensured.

Figure 5:
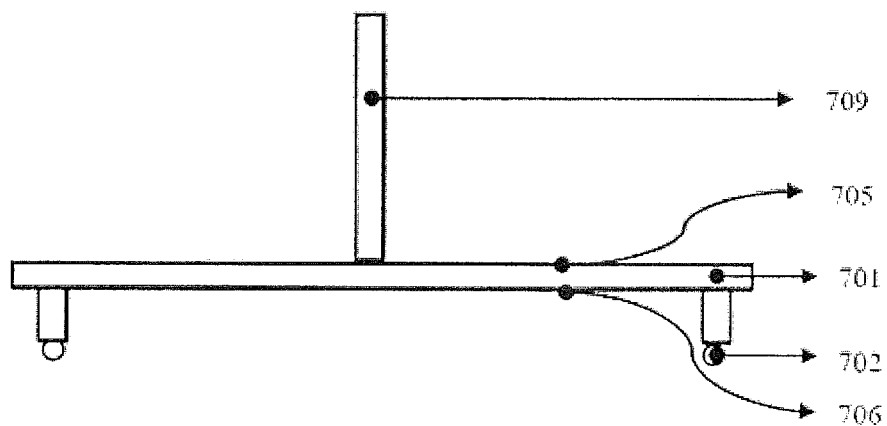
FIG. 5 is a structural schematic diagram of an imprint mechanism used with the apparatus of FIG. 1.

FIG. 5 is a structural schematic diagram of an imprint mechanism 7 of the present invention. The imprint mechanism includes a connecting support 701, second buffer gaskets 702 (fixed on the connecting support 701) and a movement execution mechanism 709, wherein the connecting support 701 is configured to connect and fix the UV light source 8, the gas valve plate 6, the second buffer gaskets 702 and the movement execution mechanism 709 (such as a one-dimensional displacement platform) for implementing vertical movement of the imprint mechanism 7 along a z-axis direction. When the imprint mechanism 7 moves from an initial position to an imprint position, a sealed area II is formed through the coaction of the second buffer gaskets 702, the mold 5 and the first buffer gaskets 201 on the vacuum chuck 2. The top surface 705 of the connecting support 701 of the imprint mechanism 7 is connected with the UV light source 8, the bottom surface 706 of the connecting support 701 of the imprint mechanism 7 is connected with the gas valve plate 6, and the top surface 705 of the connecting support 701 of the imprint mechanism 7 is connected with the movement execution mechanism 709.

Figure 6:
FIG. 6 is a structural schematic diagram of a mold feeding mechanism used with the apparatus of FIG. 1.

FIG. 6 is a structural schematic diagram of a mold feeding mechanism 9 of the present invention. The mold feeding mechanism includes an unwind roll 901 for placing a thin-film structured mold, auxiliary supporting rolls 902 and a rewind roll 903 for rewinding an used mold, wherein the unwind roll 901 for placing the thin-film structured mold is configured to place (bear) the thin-film structured mold 5 (the thin-film structured elastic mold 5 manufactured through a roll-to-roll imprinting process), the rewind roll 903 for rewinding the used mold is configured to rewind the demolded mold 5, the auxiliary supporting rolls 902 have the functions of auxiliary supporting, guiding and rectification, and a plurality of (two in this embodiment) auxiliary supporting rolls 902 may be placed at different positions. The rewind roll 903 for rewinding the used mold is an active rotating roller, the unwind roll 901 for placing the thin-film structured mold is a passive rotating roll, the rewind roll 903 for rewinding the used mold actively rotates after one-time imprinting and demolding are completed, a new mold 5 is fed and moves to the imprint site, and the next imprinting process is circulated.

Figure 7:
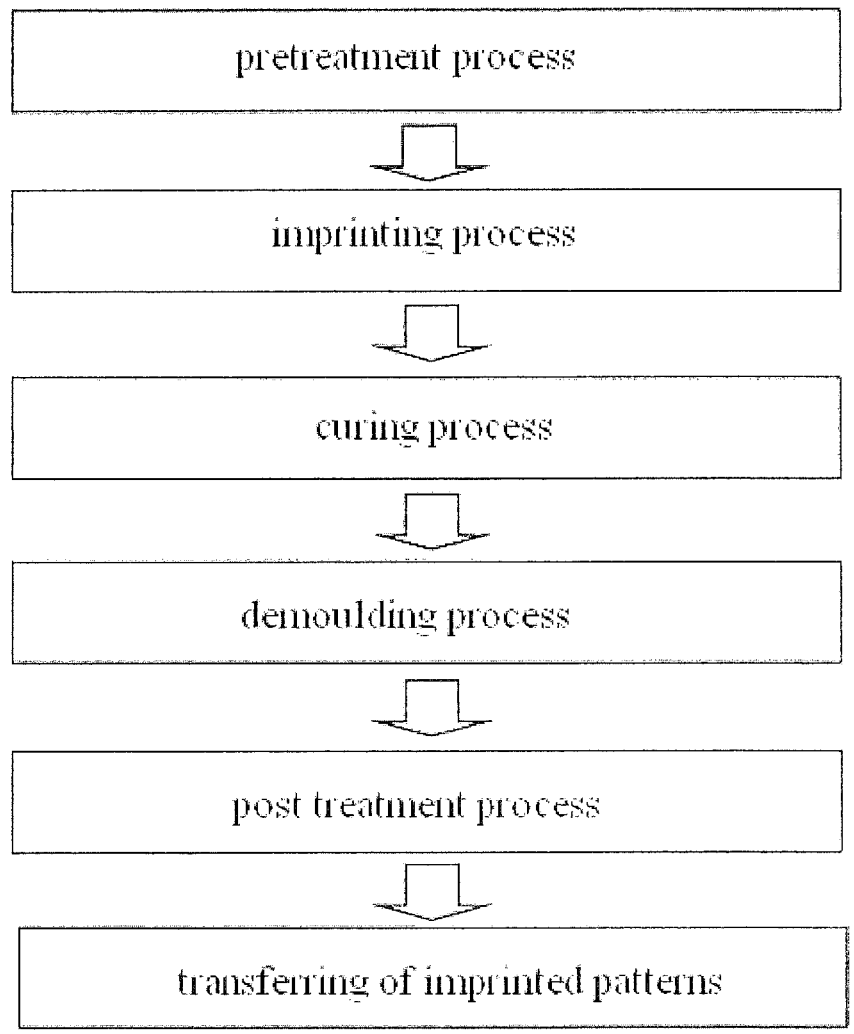
FIG. 7 is a working process flow diagram of an imprint method useful in the nanopatterning of large area substrates or fabricating large area nanostructures.

FIG. 7 is a working process flow diagram of an imprint method useful in the cost-effective mass production of nanostructures over large areas in the present invention. The method includes the following processes.

(1) Pretreatment Process

A liquid UV-curable nanoimprint resist 4 of 200 nm is spun on a 4-inch sapphire substrate 3, the substrate is placed on a vacuum chuck 2 above a wafer stage 1, and the sapphire substrate 3 coated with the UV-curable nanoimprint resist 4 is fixed on the vacuum chuck 2 in an attraction manner through vacuum suction. The wafer stage 1 is moved from an initial position to an imprint position (a central position below a mold 5).

(2) Imprinting Process

① An imprint mechanism 7 drives a gas valve plate 6 and a UV light source 8 to move from the initial position to the sapphire substrate 3 till second buffer gaskets 702 of the imprint mechanism 7 are completely in contact with the mold 5 and the mold 5 is completely in contact with first buffer gaskets 201 on the vacuum chuck 2. The space below the mold 5 and the vacuum chuck 2 form a closed area I, the space above the mold 5 and the imprint mechanism 7 define a closed area II, and sealing and air tightness of the closed areas I and II should be ensured in the imprinting and demolding processes; ② pressure pipelines 11 are opened one by one from the central position of the gas valve plate 6 to two outer sides, and the thin-film structured mold 5 is gradually in conformal contact with the UV-curable nanoimprint resist 4 on the sapphire substrate 3 under the action of uniform pressure applied by compressed air; ③ after the thin-film structured mold 5 is completely in conformal uniform contact with the UV-curable nanoimprint resist 4, a vacuum pipeline 10 is opened in the vacuum chuck 2 to form a low-pressure vacuum environment in the closed area I (on the one hand, the defect of bubbles trapped in the imprinting process is removed, and on the other hand, the thin-film structured mold 5 is completely in conformal contact with the UV-curable nanoimprint resist 4 on the non-flat substrate 3); meanwhile, pressures of all the pressure pipelines of the gas valve plate 6 are uniformly increased, a low pressure environment (a uniform imprint force is applied to the thin-film structured mold 5) is formed in the closed area II defined by the space above the mold 5 and the imprint mechanism 7, to realize complete filling of the liquid UV-curable nanoimprint resist 4 in a micro/nano structure cavity 50102 of the mold 5, and the UV-curable nanoimprint resist 4 is thinned to 60 nm which is a predefined residual layer thickness. The working pressure of the imprinting process is 30 mbar.

(3) Curing Process

③ To reduce the influence of deformation of the mold 5 on the imprinting quality, before the liquid UV-curable nanoimprint resist 4 is cured, the pressure applied to the mold 5 is gradually released, and the imprint force of 5 mbar is finally kept, so that the deformation of the mold 5 is completely recovered; ② then, the UV light source 8 is turned on, and UV light passes through the mold 5 to expose the UV-curable nanoimprint resist 4, so as to fully cure the UV-curable nanoimprint resist 4. The curing time is 20 s.

(4) Demolding Process

① Firstly, the pressure pipelines 11 of the gas valve plate 6 and the vacuum pipeline 10 of the vacuum chuck 2 are closed; ② vacuum pipelines 10 are opened one by one from the two outermost sides of the gas valve plate 6 to the center of the mold 5, so that the closed area II forms a low-pressure vacuum environment; meanwhile, a pressure pipeline 11 is opened on the vacuum chuck 2, so that the closed area I forms a low pressure environment, and continuous "peel-off" demolding of the mold 5 from the two outer sides of the sapphire substrate 3 to the center is realized; finally, the central position of the mold 5 is separated from the polymer cured on the sapphire substrate 3, to realize full separation of the mold 5 and the imprinted micro/nano feature structure 50101 and complete demolding; and ③ finally, the vacuum pipelines 10 in the gas valve plate 6, the pressure pipeline 11 of the vacuum chuck 2 and a horizontal pressure pipeline 202 of the pressure pipelines 11 of the first buffer gaskets 201 on the vacuum chuck 2 are closed (the first buffer gaskets 201 are reset).

(5) Post Treatment Process

① The imprint mechanism 7 moves upwards and returns to the initial position. Meanwhile, the wafer stage 1 moves to a substrate 3 replacing position, a horizontal vacuum pipeline 204 on the vacuum chuck 2 is closed, the imprinted sapphire substrate 3 is taken down, a new sapphire substrate 3 is loaded, the horizontal vacuum pipeline 204 on the vacuum chuck 2 is opened at the same time, and the new sapphire substrate 3 is fixed on the vacuum chuck 2. ② Meanwhile, a rewind roll 903 for rewinding the used mold rotates, the thin-film structured mold 5 is fed forwards, and the size of feeding movement is 300 mm. A new imprinting process is circulated.

(6) Transferring of Imprinted Patterns

① The residual mold 5 material in the UV-curable nanoimprint resist 4 structure is removed. Due to adhesion of the cured polymer and the demolded mold or non-uniformity of demolding force or low mechanical strength of the mold 5 and the like in the demolding process, the micro/nano feature structure 50101 of some mold 5 may be left in the imprinted feature structure (serious consequences are produced for the traditional nanoimprint process, on the one hand, the mold 5 fails, and on the other hand, the mold 5 material left in the special imprinted structure forms imprint defects), so that the mold 5 fails and imprint defects are generated. The present invention provides an ideal solution by using the water-soluble disposable mold 5. Because the mold 5 is disposable, damage to the mold 5 does not need to be worried; in addition, the mold 5 material left in the imprinted feature structure is a water-soluble material, so the substrate 3 and the imprinted feature structure thereon are put into an aqueous solution of 80° C. for 10 minutes, to remove the mold 5 residue in the feature structure.

② Then, the residual layer is removed by adopting a reactive ion etching (RIE) process, and the feature structure is transferred to the sapphire substrate 3 through an ICP dry etching process by using the cured and imprinted organic polymer as a mask. In this embodiment, the working range of the pressure pipelines 11 is 0-2 bar; and the working pressure in the imprinting process is 30 mbar. The pressure is released to 5 mbar, and the imprint force of 5 mbar is kept in the curing process.

The mold 5 is manufactured by adopting a roll-to-roll nanoimprint process, including the following procedures: (1) manufacturing a silicon mold (master mold) by adopting laser interference lithography; (2) manufacturing a nickel mold with a flaky structure by using the silicon mold as the master mold and adopting an electroforming process, and wrapping the nickel sheet mold on a cylindrical roller to form a roll imprinting working mold; and (3) manufacturing the mold 5 required by this embodiment by using the roll-type nickel mold as a working mold, using PET as a backing (support layer 502), using water-soluble PVA as an imprint material and using a roll-to-roll or roll-to-plane nanoimprint process (thermo-curing).

The working range of the vacuum pipelines 10 is less than −0.2 bar, and the working pressure in the imprinting process is −600 Pa.

Although the specific embodiments of the present invention are described in conjunction with the accompanying drawings, the protection scope of the present invention is not limited. It should be understood by those skilled in the art that various modifications or alterations made by those skilled in the art without creative efforts based on the technical solutions of the present invention are still within the protection scope of the present invention.

The invention claimed is:

1. A nanoimprint apparatus useful in the cost-effective mass production nanostructures over large areas, the apparatus comprising:
   a wafer stage,
   a vacuum chuck,
   a substrate,
   a liquid UV-curable nanoimprint resist,
   a mold,
   a gas valve plate,
   an imprint mechanism,
   a UV light source,
   a mold feeding mechanism,
   vacuum pipelines, and
   pressure pipelines,
   wherein the vacuum chuck is fixed on the wafer stage, the substrate is attached to the vacuum chuck, and the liquid UV-curable nanoimprint resist is coated on the substrate,
   wherein the mold is arranged outside an unwind roll for placing a thin-film structured mold, two auxiliary supporting rolls and a rewind roll for rewinding a used mold of the mold feeding mechanism,
   wherein the mold is placed above the substrate coated with the liquid UV-curable nanoimprint resist and below the gas valve plate through the auxiliary supporting rolls, the gas valve plate is fixed directly below the imprint mechanism, and the UV light source is fixed above the imprint mechanism, and
   wherein the vacuum pipelines and the pressure pipelines are connected together with gas inlets of the gas valve plate and with a gas inlet of the vacuum chuck.

2. The nanoimprint apparatus useful in the cost-effective mass production of nanostructures over large areas of claim 1, wherein
   the mold feeding mechanism comprises the unwind roll for placing the thin-film structured mold, the rewind roll for rewinding the used mold, the auxiliary supporting rolls, and a guiding and anti-deflecting mechanism,
   the mold feeding mechanism is divided into two axisymmetric sides about a left and a right side, the unwind roll for placing the thin-film structured mold and one auxiliary supporting roller are arranged on one of the left and right side, the unwind roll for placing the thin-film structured mold being closer to the central axis of the mold feeding mechanism than the auxiliary supporting roll, the rewind roll for rewinding the used mold and the other auxiliary supporting roll are arranged on the other of the left and right side,
   the rewind roll for rewinding the used mold and the unwind roll for placing the thin-film structured mold are symmetrical about: the central axis of the mold feeding mechanism,
   the auxiliary supporting roll and the other auxiliary supporting roll are symmetrical about the central axis of the mold feeding mechanism,
   the wafer stage is an x-y precision stage, for changing the position of the substrate and for implementing positioning and position adjustment of the substrate and the mold in the imprinting process,
   the imprint mechanism comprises a one-dimensional displacement platform moving vertically along a z-axis direction and a connecting support for the UV light source, wherein a plurality of buffer gaskets are arranged below the connecting support,
   the UV light source is a UV LED lamp array,
   a closed area I defined by the vacuum chuck and the space below the mold in the imprint working process constitutes a low-pressure vacuum environment, and a closed area II defined by the imprint mechanism and the space above the mold constitutes a pressure environment.

3. The nanoimprint apparatus useful in the cost-effective mass production of nanostructures over large areas of claim 1, wherein
   the mold (i) is a water-soluble thin-film structured, (ii) has an elastic composite transparent, (iii) is a flexible mold, and (iv) comprises a patterned layer and a support layer,
   the patterned layer has the characteristics of water solubility, high elasticity modulus, high transparency, thermal stability and good mechanical property and is made of a water-soluble macromolecular compound,
   the support layer is made of a transparent high-elasticity thin-film structured PET material,
   the patterned layer comprises a micro or nano structure to be replicated,
   the support layer is located on the patterned layer,
   the thickness of the patterned layer is 10 to 50 microns,
   the PET thickness of the support layer is 100 to 200 microns,
   the mold is manufactured by adopting a roll-type nanoimprinting process, a printing electronic technique or a nanoimprint technique.

4. The nanoimprint method of claim 3, wherein the water-soluble macromolecular compound is polyvinyl alcohol (PVA).

5. The nanoimprint method of claim 3, wherein the water-soluble macromolecular compound is poly(acrylic acid) (PAA).

6. A method for producing a high-brightness LED patterning using the nanoimprint apparatus of claim 1, the method comprising:
   (1) pretreatment;
   (2) imprinting;
   (3) curing;
   (4) demolding;
   (5) post treatment; and
   (6) transferring of imprinted patterns.

7. The nanoimprint method of claim 6, wherein the pretreatment step includes:
   spinning a layer of liquid UV-curable nanoimprint resist onto a substrate,
   placing the substrate on a vacuum chuck on a wafer stage, and
   fixing the substrate coated with the UV-curable nanoimprint resist on the vacuum chuck in an attraction manner through vacuum suction, wherein
   the wafer stage is moved from an initial position to an imprint position, the imprint position being a central position below the mold.

8. The nanoimprint method claim 6, wherein the imprinting step includes:
   driving a gas valve plate and a UV light source with an imprint mechanism to move the driving gas valve plate and the UV light source from an initial position to the substrate till buffer gaskets of the imprint mechanism are completely in close contact with a support layer on the upper surface of the mold and a patterned layer on the lower surface of the mold is completely in contact with buffer gaskets on the vacuum chuck; the space below the mold and the vacuum chuck forming a closed area I, the space above the mold and the imprint mechanism defining a closed area II such that closed areas I and II are sealed and air tight during the imprinting and demolding steps;

opening the pressure pipelines in the gas valve plate one by one from the central position of the gas valve plate to two outer sides, wherein the mold is in progressive sequential and conformal micro-contact with the UV-curable nanoimprint resist on the substrate due to compressed air pressure; and after the mold is completely in conformal uniform contact with the UV-curable nanoimprint resist, opening the vacuum pipeline in the vacuum chuck to form a low-pressure vacuum environment in the closed area I, such that the defect of bubbles trapped in the imprinting process is removed and the thin-film structured mold is completely in conformal contact with the liquid UV-curable nanoimprint resist on the substrate, and uniformly increasing the pressure of the pipelines of the gas valve plate, forming a low pressure environment is formed in the closed area II defined by the space above the mold and the imprint mechanism, applying a uniform imprint force to the thin-film structured mold to realize complete filling of the UV-curable nanoimprint resist in a micro or nano structure cavity of the mold, and thinning the UV-curable nanoimprint resist to a predefined residual layer thickness if the direct initial remaining film thickness is not the same as the height of an imprint feature structure to realize remaining film-free imprint.

9. The nanoimprint method of claim 6, wherein the curing step includes:

first, gradually releasing the pressure applied to the mold so that deformation of the mold is completely released; and second, turning on the UV light source so that the UV light passes through the mold to expose the UV-curable nanoimprint resist to fully cure the UV-curable nanoimprint resist, wherein the curing time is 10-30 s.

10. The nanoimprint method of claim 6, wherein the demolding step includes:

first, closing the pressure pipelines of the gas valve plate and the vacuum pipeline of the vacuum chuck;

second, (i) opening the vacuum pipelines in the gas valve plate one by one from two outermost sides of the gas valve plate to the center of the mold at the same time, so that the closed area II forms a low-pressure vacuum environment, (ii) opening a pressure pipeline on the vacuum chuck so that the closed area I forms a low pressure environment and continuous "peel-off" demolding of the mold from two outer sides of the substrate to the center is realized, and (iii) separating the central position of the mold from the polymer cured on the substrate to realize full separation of the mold and the imprint structure and to realize complete demolding; and third, closing the vacuum pipelines in the gas valve plate, the pressure pipeline of the vacuum chuck, and an intake pipeline of a pressure passageway of the buffer gaskets on the vacuum chuck are closed, and resetting the buffer gaskets.

11. The nanoimprint method of claim 6, wherein the post treatment step includes:

moving the imprint mechanism upwards so that it is returned to its initial position, moving the wafer stage to a substrate replacing position, closing the vacuum pipeline on the vacuum chuck, taking down the imprinted substrate, loaded a new substrate opening the vacuum pipeline on the vacuum chuck at the same time the new substrate is loaded, and fixing the new substrate on the vacuum chuck; and rotating a rewind roll for rewinding the used mold, and feeding the thin-film structured mold forwards, wherein a size of feeding movement is greater than a maximum external circle size of the substrate, and a new imprinting process is circulated.

12. The nanoimprint method of claim 6, wherein the transferring of imprinted patterns step includes:

first, removing the residual mold material in the UV-curable nanoimprint resist structure, putting the substrate and the micro or nano feature structure imprinted on the substrate into an aqueous solution of 70-100° C. for 5 to 10 minutes, and removing the residual mold material in the imprint structure; and second, either (i) transferring the feature structure to the substrate through an etching process by using the cured and imprinted UV-curable nanoimprint resist as a mask or (ii) transferring the feature structure to other functional structure material through a "lift-off" process, wherein the etching process comprises dry etching or wet etching.

13. A nanoimprint apparatus useful in the cost-effective mass production nanostructures over large areas, the apparatus comprising:

a wafer stage;

a vacuum chuck fixed on the wafer stage;

a substrate attached to the vacuum chuck;

a liquid UV-curable nanoimprint resist coated on the substrate;

a mold;

a gas valve plate;

an imprint mechanism;

a UV light source;

a mold feeding mechanism;

vacuum pipelines; and pressure pipelines;

wherein the mold is arranged outside an unwind roll for placing a thin-film structured mold, two auxiliary supporting rolls and a rewind roll for rewinding a used mold of the mold feeding mechanism, wherein the mold is placed above the substrate coated with the liquid UV-curable nanoimprint resist and below the gas valve plate through the auxiliary supporting rolls, the gas valve plate is fixed below the imprint mechanism, and the UV light source is fixed above the imprint mechanism, wherein the vacuum pipelines and the pressure pipelines are connected together with gas inlets of the gas valve plate and with a gas inlet of the vacuum chuck, wherein the mold feeding mechanism comprises the unwind roll for placing the thin-film structured mold, the rewind roll for rewinding the used mold, the auxiliary supporting rolls, and a guiding and anti-deflecting mechanism, wherein the mold feeding mechanism is divided into two axisymmetric sides about a left and a right side, the unwind roll for placing the thin-film structured mold and one auxiliary supporting roller are arranged on one of the left and right side, the unwind roll for placing the thin-film structured mold being closer to the central axis of the mold feeding mechanism than the auxiliary supporting roll, the rewind roll for rewinding the used mold and the other auxiliary supporting roll are arranged on the other of the left and right side, wherein the rewind roll for rewinding the used mold and the unwind roll for placing the thin-film structured mold are symmetrical about the central axis of the mold feeding mechanism, wherein the auxiliary supporting roll and the other auxiliary supporting roll are symmetrical about the central axis of the mold feeding mechanism, wherein the wafer stage is an x-y precision stage, for changing the position of the substrate and for implementing positioning and position adjustment of the substrate and the mold in the imprinting process, wherein the imprint mechanism comprises a one-dimensional displacement platform moving vertically along a z-axis direction and a connecting support for the UV light source, wherein a plurality of buffer gaskets are arranged below the connecting support, wherein the UV light source is a UV LED lamp array, wherein the working range of the pressure pipelines is 0-2 bar, and the working pressure in the imprinting process is 10-100 mbar, wherein the working range of the vacuum pipelines is −0.1 bar to −0.4 bar, and the working pressure in the imprinting process is −300 Pa to −5 kPa, and wherein a closed area I defined by the vacuum chuck and the space below the mold in the imprint working process constitutes a low-pressure vacuum environment, and a closed area II defined by the imprint mechanism and the space above the mold constitutes a pressure environment.

* * * * *